US011450697B2

(12) United States Patent
Chen et al.

(10) Patent No.: US 11,450,697 B2
(45) Date of Patent: Sep. 20, 2022

(54) CHIP PACKAGE WITH SUBSTRATE HAVING FIRST OPENING SURROUNDED BY SECOND OPENING AND METHOD FOR FORMING THE SAME

(71) Applicant: XINTEC INC., Taoyuan (TW)

(72) Inventors: Kuei-Wei Chen, Taoyuan (TW); Chia-Ming Cheng, New Taipei (TW); Chia-Sheng Lin, Taoyuan (TW)

(73) Assignee: XINTEC INC., Taoyuan (TW)

( * ) Notice: Subject to any disclaimer, the term of this patent is extended or adjusted under 35 U.S.C. 154(b) by 86 days.

(21) Appl. No.: 16/581,594

(22) Filed: Sep. 24, 2019

(65) Prior Publication Data

US 2020/0098811 A1 Mar. 26, 2020

Related U.S. Application Data

(60) Provisional application No. 62/736,150, filed on Sep. 25, 2018.

(51) Int. Cl.
*H01L 27/146* (2006.01)

(52) U.S. Cl.
CPC .. *H01L 27/14618* (2013.01); *H01L 27/14632* (2013.01); *H01L 27/14636* (2013.01);
(Continued)

(58) Field of Classification Search
CPC ......... H01L 27/14618; H01L 27/14632; H01L 27/14636; H01L 27/14687;
(Continued)

(56) References Cited

U.S. PATENT DOCUMENTS 10,424,540 B2   9/2019  Ho et al.
10,515,892 B2 * 12/2019  Bu .................. H01L 21/3081
(Continued)

FOREIGN PATENT DOCUMENTS

CN     101699622 A    4/2010
CN     103456683      12/2013
(Continued)

OTHER PUBLICATIONS

Foreign Office Action issued by the Taiwan Intellectual Property Office, dated May 7, 2020.

*Primary Examiner* — Lex H Malsawma
(74) *Attorney, Agent, or Firm* — Liu & Liu

(57) ABSTRACT

A chip package including a substrate, a first conductive structure, and an electrical isolation structure is provided. The substrate has a first surface and a second surface opposite the first surface), and includes a first opening and a second opening surrounding the first opening. The substrate includes a sensor device adjacent to the first surface. A first conductive structure includes a first conductive portion in the first opening of the substrate, and a second conductive portion over the second surface of the substrate. An electrical isolation structure includes a first isolation portion in the second opening of the substrate, and a second isolation portion extending from the first isolation portion and between the second surface of the substrate and the second conductive portion. The first isolation portion surrounds the first conductive portion.

13 Claims, 10 Drawing Sheets

(52) U.S. Cl.
CPC .. *H01L 27/14687* (2013.01); *H01L 27/14698* (2013.01); *H01L 27/1464* (2013.01); *H01L 27/14621* (2013.01); *H01L 27/14627* (2013.01)

(58) Field of Classification Search
CPC ......... H01L 27/14698; H01L 27/14621; H01L 27/14627; H01L 27/1464
See application file for complete search history.

(56) References Cited

U.S. PATENT DOCUMENTS

| | | | | |
|---|---|---|---|---|
| 2007/0048896 | A1* | 3/2007 | Andry | .............. H01L 21/76898 438/106 |
| 2007/0152349 | A1* | 7/2007 | Chung | .............. H01L 21/76898 257/786 |
| 2012/0292782 | A1* | 11/2012 | Lee | ...................... H01L 23/481 257/774 |
| 2013/0001621 | A1 | 1/2013 | Shiu et al. | |
| 2014/0035144 | A1* | 2/2014 | Bang | ..................... H01L 23/481 257/751 |
| 2015/0263060 | A1 | 9/2015 | Park et al. | |
| 2016/0322312 | A1 | 11/2016 | Shen et al. | |
| 2018/0102321 | A1* | 4/2018 | Ho | ......................... H01L 24/16 |

FOREIGN PATENT DOCUMENTS

| | | |
|---|---|---|
| CN | 106098639 | 11/2016 |
| JP | 2008066679 | 3/2008 |
| JP | 2008277709 | 11/2008 |
| JP | 2009272490 | 11/2009 |
| JP | 2016111285 | 6/2016 |
| JP | 2016213349 | 12/2016 |
| TW | 201826510 | 7/2018 |
| WO | 2013160976 | 10/2013 |

\* cited by examiner

CHIP PACKAGE WITH SUBSTRATE HAVING FIRST OPENING SURROUNDED BY SECOND OPENING AND METHOD FOR FORMING THE SAME

CROSS REFERENCE TO RELATED APPLICATIONS

This application claims the benefit of U.S. Provisional Application No. 62/736,150 filed on Sep. 25, 2018, the entirety of which is incorporated by reference herein.

BACKGROUND OF THE INVENTION

Field of the Invention

The invention relates to chip package technology, and in particular to a chip package with substrate through vias and a method for forming the same.

Description of the Related Art

Optoelectronic devices (such as an image sensing device) play an important role in capturing images and have been widely used in electronic products such as digital cameras, digital video recorders, and mobile phones. The chip packaging process is an important step in the fabrication of electronic products. Chip packages not only protect the sensing chips therein from outer environmental contaminants but also provide electrical connection paths between the electronic elements inside and those outside of the chip packages.

With the complicated functionality of electronic and optoelectronic products, the semiconductor chips with high performance or multifunctionality that are used in the chip package typically require more input/output (I/O) pins. Therefore, the conductive pad pitch must be reduced so as to increase the number of conductive pads in the electronic device package when the size of the chip package is not increased. As a result, the difficulty of forming the chip packages may be increased, so that the yield of such chip packages may be reduced.

Accordingly, there is a need for a novel chip package and methods for forming the same capable of eliminating or mitigating the aforementioned problems.

BRIEF SUMMARY OF THE INVENTION

An embodiment of the invention provides a chip package which includes a substrate having a first surface and a second surface opposite the first surface, and comprising a first opening and a second opening surrounding the first opening, wherein the substrate includes a sensor device adjacent to the first surface of the substrate; a first conductive structure including: a first conductive portion in the first opening of the substrate; and a second conductive portion over the second surface of the substrate; and an electrical isolation structure including a first isolation portion in the second opening of the substrate; and a second isolation portion extending from the first isolation portion and between the second surface of the substrate and the second conductive portion.

An embodiment of the invention provides a method for forming a chip package which includes providing a substrate, the substrate having a first surface and a second surface opposite the first surface, wherein the substrate includes a sensing device adjacent to the first surface of the substrate; forming a first opening and a second opening surrounding the first opening in the substrate; forming a first isolation portion of an electrical isolation structure in the second opening of the substrate, and forming a second portion of the electrical isolation structure on the second surface of the substrate, wherein the second isolation portion extends from the first isolation portion; and forming a first conductive portion of a first conductive structure in the first opening of the substrate.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. In addition, the present disclosure may repeat reference numbers and/or letters in the various embodiments. This repetition is for the purpose of simplicity and clarity, and does not imply any relationship between the different embodiments and/or configurations discussed. Furthermore, when a first material layer is referred to as being on or overlying a second material layer, the first material layer may be in direct contact with the second material layer, or spaced apart from the second material layer by one or more material layers.

A chip package according to an embodiment of the present invention may be used to package micro-electromechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), biometric devices, micro fluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, fingerprint recognition devices, micro actuators, surface acoustic wave devices, pressure sensors, ink printer heads, and so on.

The above-mentioned wafer-level package process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level package process. In addition, the above-mentioned wafer-level package process may also be adapted to form a chip package having multi-layer integrated circuit devices by a stack of wafers having integrated circuits.

Figure 1:
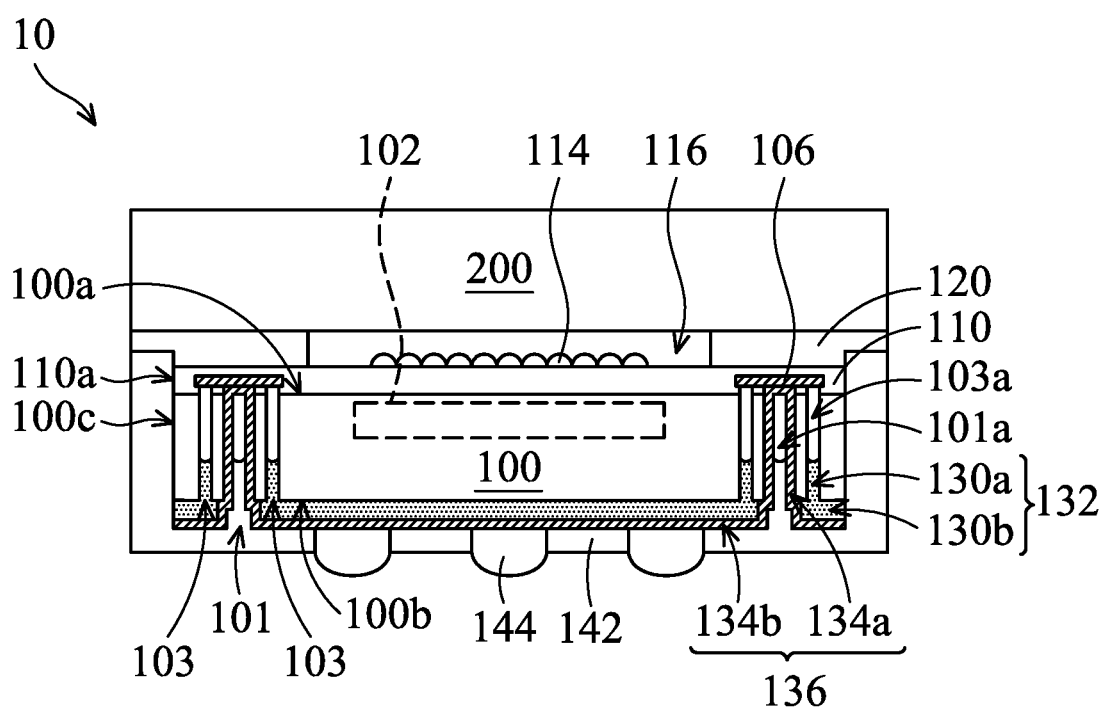
FIG. 1 is a cross-sectional view of an exemplary embodiment of a chip package according to the invention.

Refer to FIG. 1, which illustrates a cross-sectional view of an exemplary embodiment of a chip package 10 according to the invention. In some embodiments, the chip package 10 includes a substrate 100. The substrate 100 may be formed of silicon or another semiconductor material. The substrate 100 has a first surface 100a (e.g., upper surface), a second surface 100b (e.g., lower surface) opposite the first surface 100a, and a sidewall surface 100c at the edge of the substrate 100. In some embodiments, the substrate 100 includes a sensing region 102 therein. The sensing region 102 may be adjacent to the first surface 100a and include a sensing device (not shown) therein, such as an image sensing device. In some other embodiments, the sensing region 102 may include a device that is configured to sense biometrics (e.g., a fingerprint recognition device), or another suitable sensing element.

In some embodiments, an insulating layer 110 is disposed on the first surface 100a of the substrate 100. A chip/die may be comprised of the insulating layer 110 and the substrate 100. Moreover, the insulating layer 110 may be formed of an interlayer dielectric (ILD) layer, an inter-metal dielectric (IMD) layer, a passivation layer or a combination thereof. To simplify the diagram, only a single insulating layer 110 is depicted herein.

In some embodiments, the insulating layer 110 includes one or more conductive pads 106 adjacent to the first surface 100a. In some embodiments, the conductive pad 106 may be formed of a single conductive layer or multiple conductive layers. To simplify the diagram, only few conductive pads 106 including a single conductive layer are depicted herein as an example. In some embodiments, the sensing device in the sensing region 102 is electrically connected to the conductive pad 106 via interconnect structures (not shown) in the substrate 100 and the insulating layer 110.

In some embodiments, the substrate 100 includes first openings 101 and second openings 103, and each of the second openings 103 surrounds a corresponding first opening 101. To simplify the diagram, only two first opening 101 and two second openings 103 that surround those first openings 101 are depicted herein. In some embodiments, the first openings 101 and the second openings 103 extend from the second surface 100b of the substrate 100 to the first surface 100a of the substrate 100, so as to pass through the substrate 100 and the insulating layer 110, and expose the correspond conductive pads 106. A portion of the conductive pad 106 laterally protrudes from the edge of the corresponding second opening 103. Namely, as viewed from a top-view perspective, the first opening 101 and the second opening 103 are entirely located at the region of the corresponding pad 106.

Figure 2A:
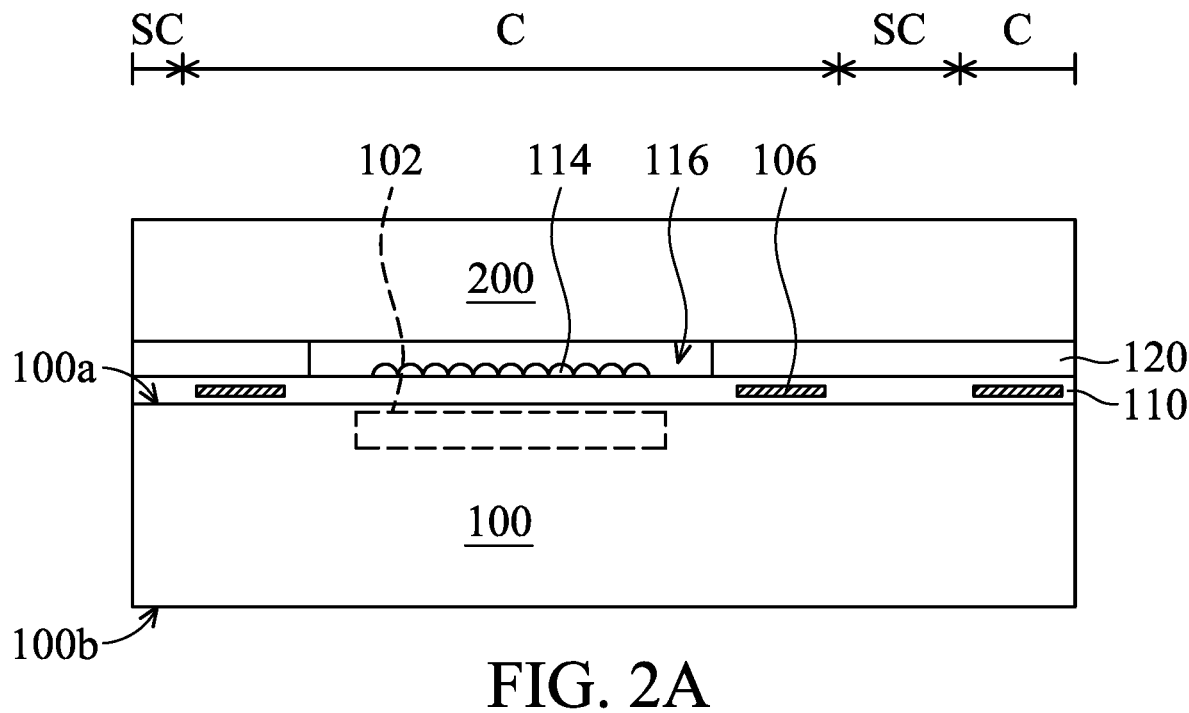
FIGS. 2A to 2H are cross-sectional views of an exemplary embodiment of a method for forming a chip package according to the invention.
Figure 2B:
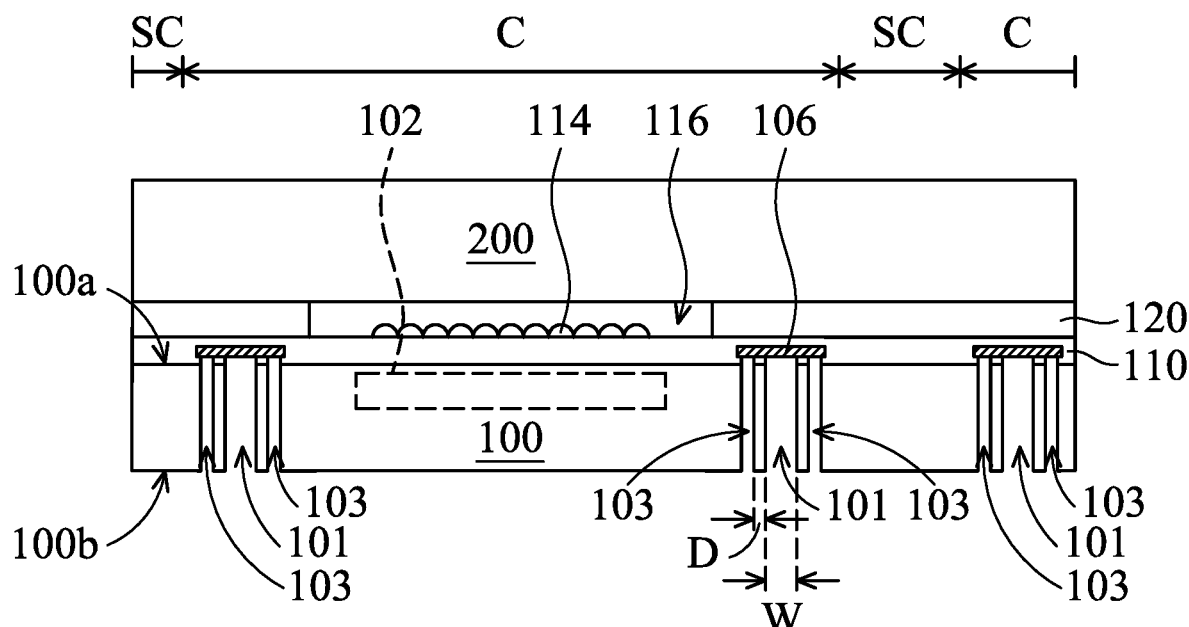

In some embodiments, the first opening 101 is spaced a distance D apart from the corresponding second opening 103 (as indicated in FIG. 2B), so that a portion of the substrate 100 surrounds the first opening 103 and surrounded by the corresponding second opening 103. In some embodiments, the distance D is less than or equal to the width W (as indicated in FIG. 2B) of the first opening. For example, the distance D is about 10 μm.

In some embodiments, the first diameter of the first openings 101 at the second surface 100b of the substrate 100 (i.e., the lower width of the first openings 101) is substantially equal to the second diameter of the first openings 101 at the first surface 100a of the substrate 100 (i.e., the upper width of the first openings 101). As a result, the first openings 101 have substantially perpendicular sidewalls. The top-view profile of the first openings 101 is circular, and it should be realized that the top-view profile of the first openings 101 may be another shape, and they are not limited thereto. In some embodiments, the first diameter of the second openings 103 at the second surface 100b of the substrate 100 (i.e., the lower width of the second openings 103) is substantially equal to the second diameter of the second openings 103 at the first surface 100a of the substrate 100 (i.e., the upper width of the second openings 103). As a result, the second openings 103 have substantially perpendicular sidewalls. The top-view profile of the second openings 103 is ring-shaped, and it should be realized that the top-view profile of the first openings 101 may be another shape, and they are not limited thereto.

In some embodiments, the chip package 10 further includes an optical element 114 disposed on the insulating layer 110 and corresponding to the sensing region 102. In one embodiment, the optical element 114 includes a microlens array, a color filter, or a combination thereof or another suitable optical element.

In some embodiments, the chip package 10 further includes a cover plate 200 disposed over the first surface 100a of the substrate 100 so as to protect the optical element 114. In one embodiment, the cover plate 200 includes glass, quartz, transparent polymer or another suitable transparent material.

In some embodiments, the chip package 10 further includes a spacer layer (or referred to as dam) 120 disposed between the substrate 100 and the cover plate 200. The spacer layer 120 covers the conductive pads 106 and exposes the optical element 114. In the embodiment, the cover plate 200, the spacer layer 120, and the insulating layer 110 together surround a cavity 116, so that the optical element 114 is located in the cavity 116. In some other embodiments, the spacer layer 120 covers the optical element 114, so that there is no cavity between the cover plate 200 and the insulating layer 110.

In some embodiments, the spacer layer 120 does not substantially absorb moisture and may be non-adhesive. In those cases, the cover plate 200 is attached on the insulating layer 110 on the substrate 100 through an additional adhesive layer. In some other embodiments, the spacer layer 120 may itself be adhesive. In those cases, the cover plate 200 can attach to the insulating layer 110 on the substrate 100 by the spacer layer 120. As a result, the spacer layer 120 may contact none of the adhesion glue, thereby assuring that the spacer layer 120 will not move due to the disposition of the adhesion glue. Furthermore, since the adhesion glue is not needed, the optical element 114 can be prevented from being contaminated by an overflow of adhesion glue.

In some embodiments, the chip package 10 further includes an electrical isolation structure 132 disposed on the second surface 100b of the substrate 100. In some embodiments, the electrical isolation structure 132 includes a first isolation portion 130a and a second isolation portion 132b.

The first isolation portion 130a fills each of the second openings 103 of the substrate 100, and the second isolation portion 130b extends onto the second surface 100b of the substrate 100 from the first isolation portion 130a. In some embodiments, the first isolation portion 130a partially fills the second opening 103, so as to form a hole 103a between the bottom of the second opening 103 and the first isolation portion 130a. The hole 103a can provide an electrical isolation between the substrate and subsequently formed redistribution layer, and can be a buffer between the electrical isolation structure 132 and the substrate 100. In some embodiments, the interface between the hole 103a and the first isolation portion 130a has an arcuate contour. In some embodiments, the electrical isolation structure 132 includes photoresist material, epoxy resin, or another suitable organic polymer materials (such as polybenzoxazole (PBO), polyimide, butylcyclobutene (BCB), parylene, polynaphthalenes, fluorocarbons or acrylates.

In some embodiments, the chip package 10 further includes a first conductive structure 136 disposed on the electrical isolation structure 132. In some embodiments, the first conductive structure 136 includes a first conductive portion 134a and a second conductive portion 134b. The first conductive portion 134a is disposed in each of the first openings 101, so that the first isolation portion 130a surrounds the first conductive portion 134a. Moreover, the first conductive portion 134a conformally covers the sidewalls and the bottom of each first opening 101 and extends into the insulating layer 110 to electrically connect the corresponding conductive pad 106. In some embodiments, the second conductive portion 134b extends onto the second isolation portion 130b from the first conductive portion 134a, so that the second isolation portion 130b extends between the second surface 100b of the substrate 100 and the second conductive portion 1434b. In those cases, the first conductive portion 134a may be referred to as a redistribution layer, and the second conductive portion 134b and the first conductive portion 134a are formed of the same conductive material layer. The first conductive structure 136 (e.g., the redistribution layer) may be formed of a single layer or multiple layers. To simplify the diagram, only a single conductive layer is depicted herein as an example. In some embodiments, the first conductive structure 136 includes aluminum, titanium, tungsten, copper, nickel, gold or a combination thereof.

The first conductive structure 136 is electrically isolated from the substrate 100 via the electrical isolation structure 132, and is in direct electrical contact with or indirectly electrically connected to the exposed conductive pads 106 through the first openings 101. Therefore, the first conductive portion 134a in the opening 101 is also referred to as a through substrate via (TSV).

In some embodiments, the chip package 10 further includes a passivation layer 142 disposed over the second surface 100b of the substrate 100 to cover the first conductive structure 136 and the electrical isolation structure 132. Moreover, the passivation layer 142 extends into the spacer layer 120 along a sidewall surface 100c of the edge of the substrate 100 and a sidewall surface 110a of the edge of the insulating layer 110. For example, the extending length is about a half of the thickness of the spacer layer 120, so that the passivation layer is capable of sufficiently protecting the substrate 100 and the insulating layer 110. In some embodiments, the passivation layer 142 has openings 142a (as indicated in FIG. 2G) to expose a portion of the second conductive portion 134b.

In some embodiments, the passivation layer 142 fills the first openings 101 to cover the first conductive portion 134a. The first openings 101 are not fully filled with the passivation layer 142, so that a hole 101a is formed between the first conductive portion 134a and the passivation layer 146 that are formed within the first opening 101. Therefore, the hole 101a can be a buffer between the passivation layer 142 and the first conductive portion 134a in thermal cycles induced in subsequent processes. Unwanted stress, which is induced between the passivation layer 142 and the first conductive structure 136 as a result of mismatch of thermal expansion coefficients, is reduced. Moreover, the first conductive structure 136 is prevented from being excessively pulled by the passivation layer 142 when external temperature or pressure dramatically changes. As a result, problems such as peeling or disconnection of the first conductive structure 136, which is close to the conducting pads 106, are avoidable. In some embodiments, the interface between the hole 101a and the passivation layer 142 has an arcuate contour.

Figure 2C:
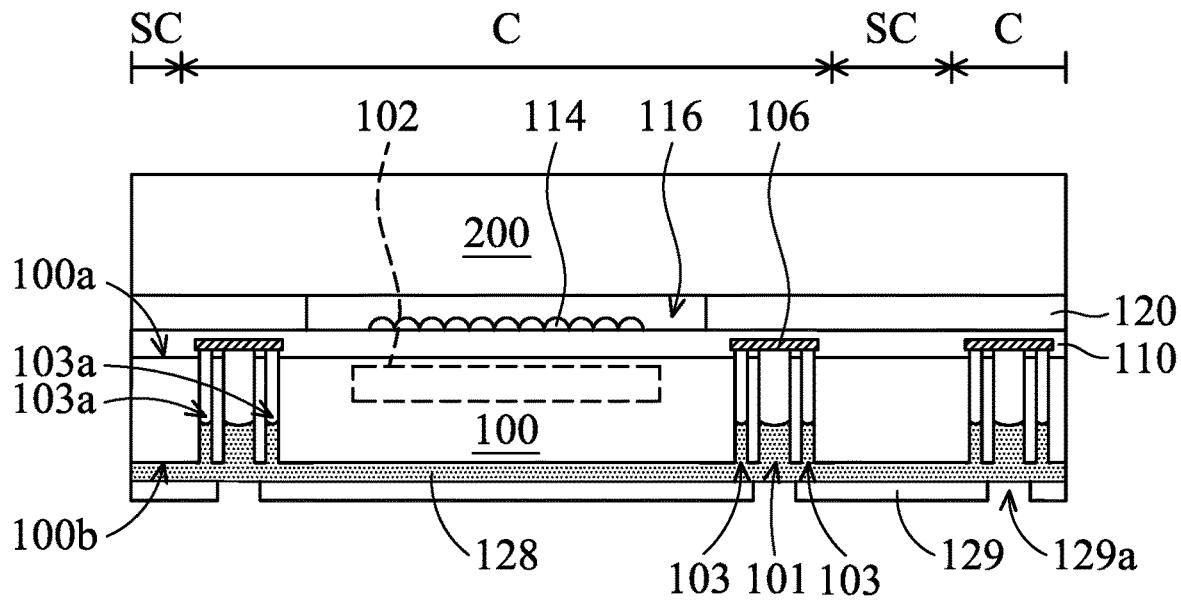
Figure 2D:
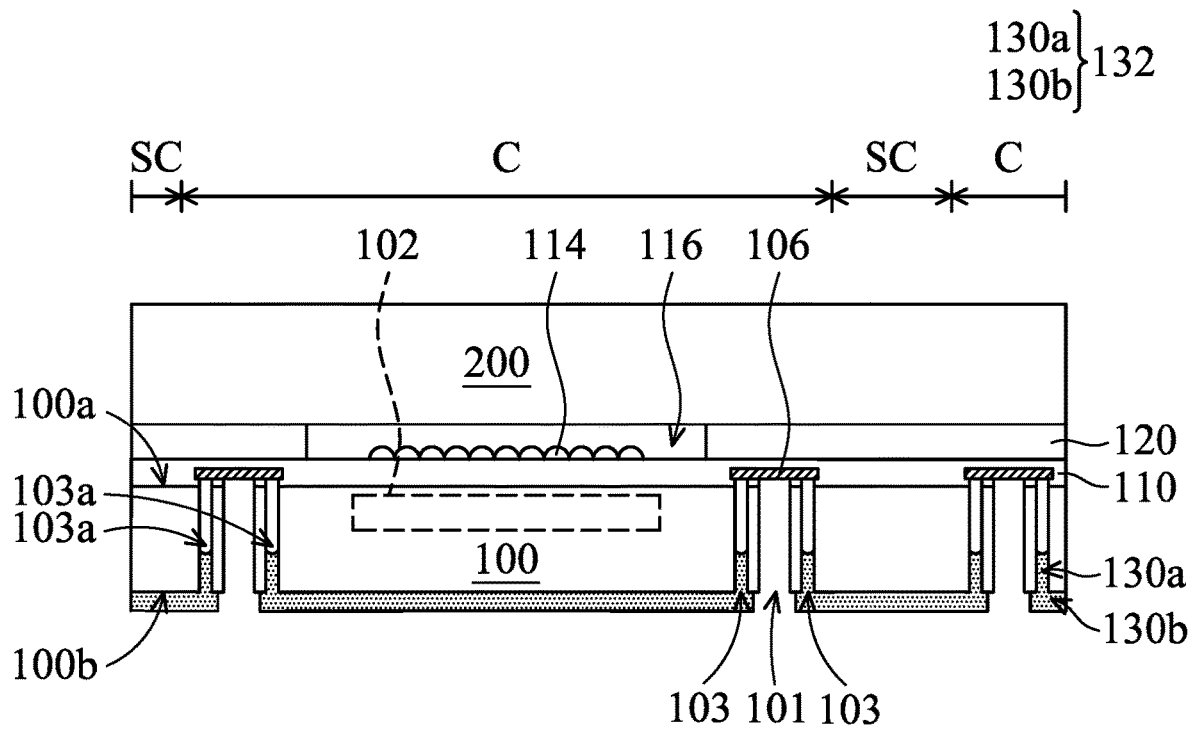
Figure 2E:
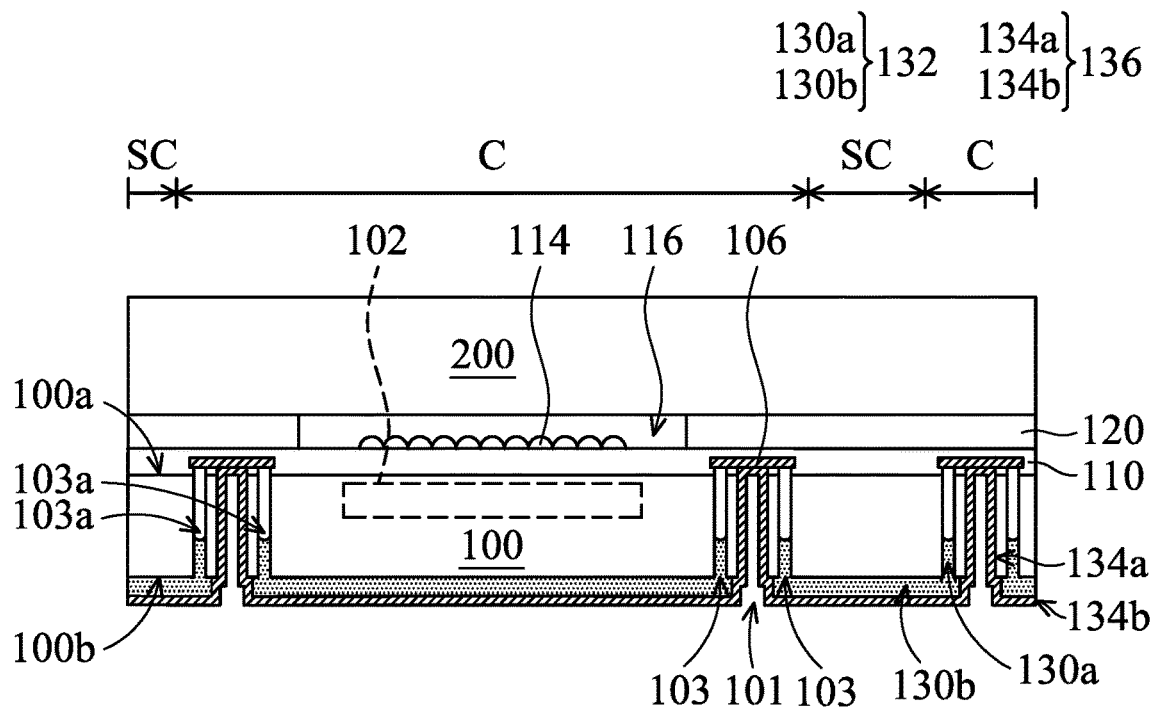
Figure 2F:
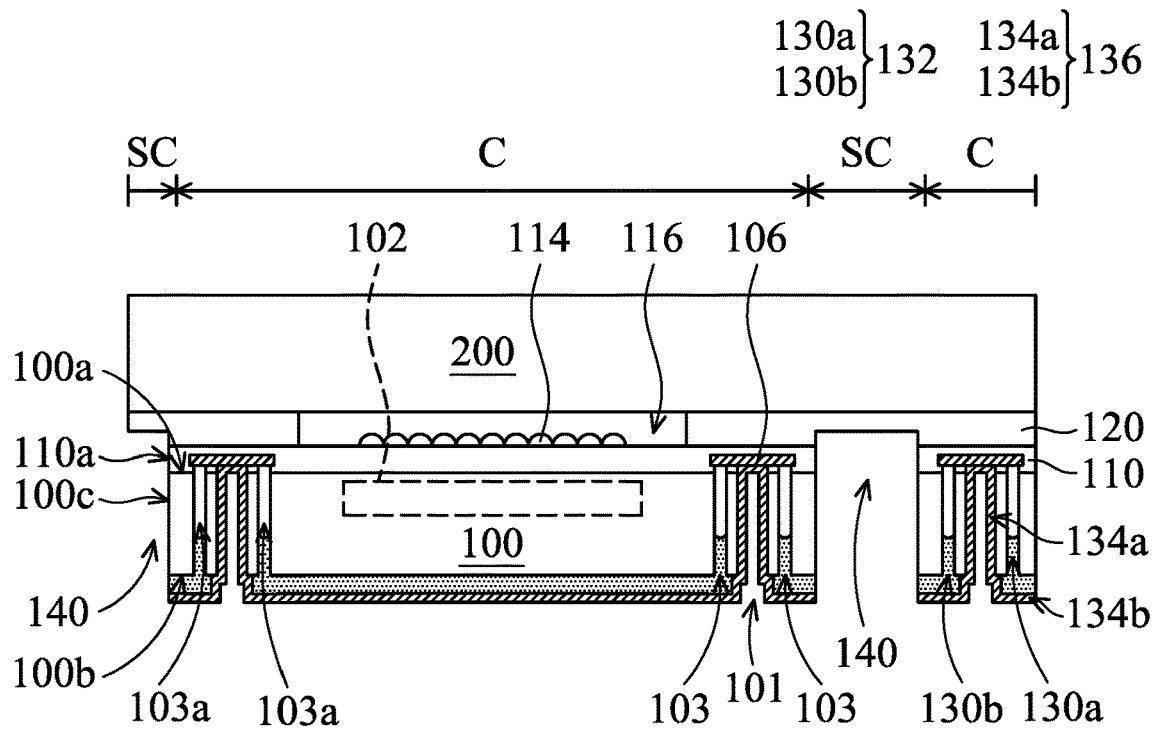
Figure 2G:
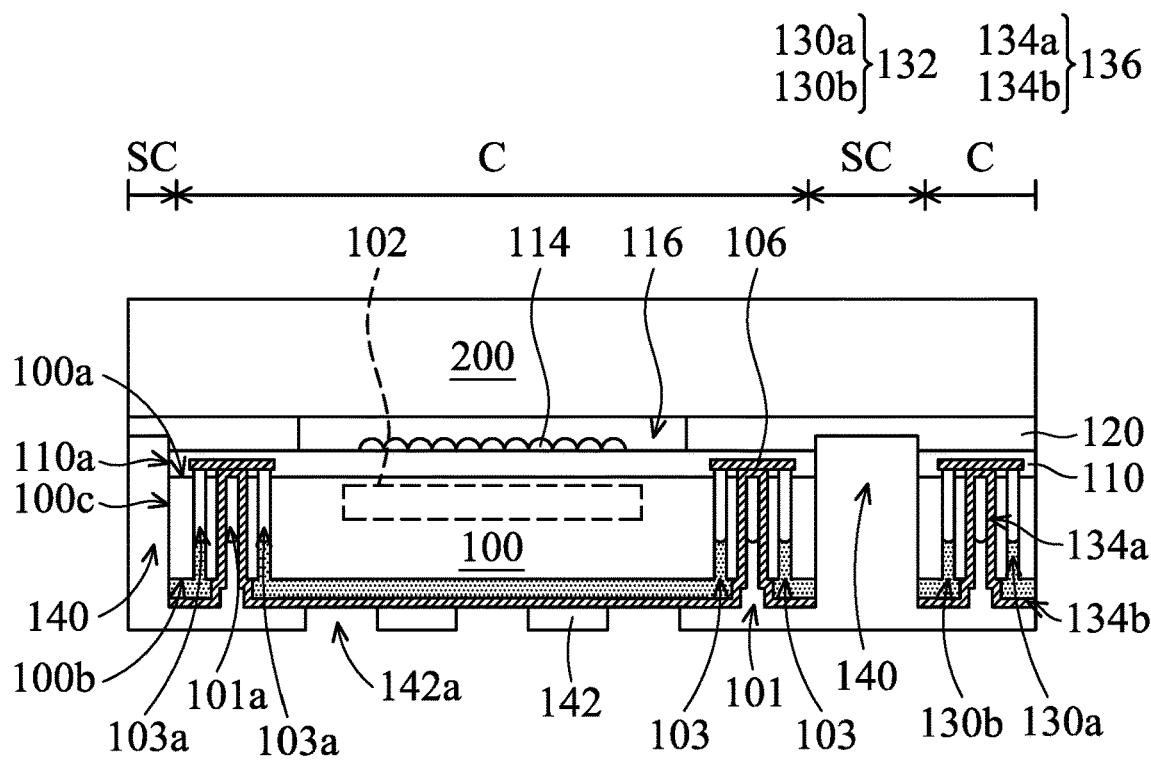

In some embodiments, the chip package 10 further includes second conductive structures 144 (such as solder balls, bumps or conductive pillars) is correspondingly disposed in the openings 142a (as indicated in FIG. 2G) of the passivation layer 142, so as to be electrically connected to the exposed second conductive portion 134b. In such embodiments, the chip package 10 having the second conductive structures 144 is a ball grid array (BGA) package. However, in some other embodiments, the chip package 10 does not have the second conductive structures 144. In those cases, the chip package 10 may be a land grid array (LGA) package.

In the embodiments mentioned above, the chip package 10 includes a front side illumination (FSI) sensing device. However, in other embodiments, the chip packages 10 may include a back side illumination (BSI) sensing device.

FIGS. 2A to 2H are cross-sectional views of an exemplary embodiment of a method for forming a chip package 10 according to the invention. Elements in FIGS. 2A to 2H that are the same as those in FIG. 1 are labeled with the same reference numbers as in FIG. 1 and are not described again for brevity. Refer to FIG. 2A, a substrate 100 is provided. The substrate 100 has a first surface 100a (e.g., upper surface) and a second surface 100b (e.g., lower surface) opposite thereto, and may include chip regions and a scribe line region that surrounds the chip regions and separates the adjacent chip regions from each other. To simplify the diagram, only a complete chip region C, an incomplete chip region C adjacent thereto, and a scribe line region SC separating these chip regions C are depicted herein. In some embodiments, the substrate 100 is a silicon wafer so as to facilitate the wafer-level packaging process. In some other embodiments, the substrate 100 is a silicon substrate or another semiconductor substrate. The chip region C of the substrate 100 includes a sensing region 102 and the sensing region 102 may be adjacent to the first surface 100a of the substrate 100. Moreover, the sensing region 102 may include a sensing device (not shown) therein, such as an image sensing device.

In some embodiments, an insulating layer 110 is formed on the first surface 100a of the substrate 100. The insulating layer 110 may include an interlayer dielectric (ILD) layer, inter-metal dielectric (IMD) layer, a passivation layer or a combination thereof. In some embodiments, the insulating layer 110 may include an inorganic material, such as silicon oxide, silicon nitride, silicon oxynitride, metal oxide, or a combination thereof, or another suitable insulating material. In some embodiments, one or more conductive pads 106 are formed in the insulating layer 110. The conductive pads 106 correspond to the chip regions C of the substrate 100 and are adjacent to the first surface 100a of the substrate 100. In some embodiments, the sensing device in the sensing region 102 is electrically connected to the conductive pad 106 via interconnect structures (not shown) in the substrate 100 and the insulating layer 110.

In some embodiments, the aforementioned structure is fabricated by sequentially performing a front-end process (for example, the sensing region 102 is formed in the substrate 100) and a back-end process (for example, the insulating layer 110, the interconnection structures, and the conductive pads 106 are formed on the substrate 100) of a semiconductor device. In other words, the following method for forming a chip package includes subsequent packaging processes performed on the substrate after the back-end process is finished.

In some embodiments, an optical element 114 is formed on the insulating layer 110 on the first surface 100a of the substrate 100, and corresponds to the sensing region 102. In some embodiments, the optical element 114 may include a microlens array, a color filter, or a combination thereof or another suitable optical element.

Afterward, a cover plate 200 is provided. In the embodiment, the cover plate 200 includes glass, quartz, transparent polymer or another suitable transparent material. Afterwards, a spacer layer 120 is formed on the cover plate 200. The cover plate 200 is bonded onto the insulating layer 110 on the first surface 100a of the substrate 100 via the spacer layer 120. A cavity 116 is formed between the cover plate 200 and the substrate 100 in the chip region C via the spacer layer 120 that surrounds the sensing region 102 of the substrate 100, so that the optical element 114 is located in the cavity 116, and the optical element 114 in the cavity 116 is protected by the cover plate 200.

In some other embodiments, the spacer layer 120 is formed on the insulating layer 110 over the substrate 100 and then the cover plate 200 is bonded to the insulating layer 110 over the substrate 100. In some other embodiments, the spacer layer 120 covers the optical element 114, so that there is no cavity between the substrate 100 and the cover plate 200.

In some embodiments, the spacer layer 120 is formed by a deposition process (such as a coating process, a physical vapor deposition process, a chemical vapor deposition process or another suitable process). Moreover, the spacer layer 120 includes epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), or another suitable insulating material. Alternatively, the spacer layer 120 includes a photoresist material, and is patterned by a lithography process to form the cavity 116.

Refer to FIG. 2B, a thinning process (such as an etching process, a milling process, a grinding process or a polishing process) is performed on the second surface 100b of the substrate 100 by using the cover plate 200 as a carrier substrate, to reduce the thickness of the substrate 100. In some embodiments, the thickness of the substrate is in a range from about 100 μm to about 200 μm after the thinning process is performed.

Afterwards, in some embodiments, one or more first opening 101 and one or more corresponding second openings 103 are formed in the substrate 100 in each of the chip regions C by a lithography process and an etching process (such as a dry etching process, a wet etching process, a plasma etching process, a reactive ion etching process, or another suitable process). The first opening 101 corresponds to a conductive pad 106, and the second opening 103 surrounds the first opening 101 and also corresponds to the conductive pad 106. The first opening 101 and the second opening 103 extend from the second surface 100b of the substrate 100 to the first surface 100a of the substrate, so as to pass through the substrate 100.

Afterwards, the first opening 101 and the second opening 103 may be extended in the insulating layer 110 to expose the conductive pad 106 by an etching process (such as a dry etching process, a wet etching process, a plasma etching process, a reactive ion etching process, or another suitable process). In some embodiments, a portion of the conductive pad 106 lateral protrudes from the edge of the second opening 103. In some embodiments, the first opening 101 is spaced a distance D apart from the corresponding second opening 103, so that a portion of the substrate 100 surrounds the first opening 101 and is surrounded by the second opening 103. In some embodiments, the distance D is less than or equal to the width W of the first opening 101. For example, the distance D is about 10 μm.

In some embodiments, the first openings 101 and the second openings 103 respectively have substantially perpendicular sidewalls. Moreover, the top-view profile of the first opening 101 is circular. The top-view profile of the second opening 103 is ring-shaped, such as circular ring-shaped. It should be realized that the top-view profiles of the first opening 101 and the second opening 103 may be another shape, and they are not limited thereto.

Refer to FIGS. 2C and 2D, an electrical isolation structure 132 is formed on the second surface 100b of the substrate 100. In some embodiments, an electrical isolation material layer 128 is formed on the second surface 100b of the substrate 100 and partially fills the first openings 101 and the second openings 103 by a deposition process (such as a spin coating process). In some embodiments, the electrical isolation material layer 128 includes epoxy resin, or another suitable organic polymer material (such as polyimide, butylcyclobutene, parylene, polynaphthalenes, fluorocarbons or acrylates).

Afterwards, a masking layer 129 is formed on the electrical isolation material layer 128. In some embodiments, the masking layer 129 has openings 129a corresponding to the first openings 101 and exposing the electrical isolation material layer 128 above the first openings 101, as shown in FIG. 2C. Next, in some embodiments, the exposed electrical isolation material layer 128 is removed by an etching process (such as a dry etching process, a wet etching process, a plasma etching process, a reactive ion etching process, or another suitable process) using the masking layer 129 as an etch mask. The remaining electrical isolation material layer 128 forms the electrical isolation structure 132, as shown in FIG. 2D.

In some other embodiments, the electrical isolation material layer 128 includes a photoresist material, and can be patterned by a lithography process without the use of the masking layers 129 and performing the processes mentioned above.

In some embodiments, the electrical isolation structure 132 includes a first isolation portion 130a and a second isolation portion 130b. The first isolation portion 130a partially fills the second opening 103, so as to form a hole 103a between the bottom of the second opening 103 and the first isolation structure 130a. Moreover, the second isolation structure 103b extends onto the second surface 100b of the substrate 100 from the first isolation structure 130a.

Refer to FIG. 2E, a first conductive structure 136 is formed on the electrical isolation structure 132. In some embodiments, the first conductive structure 136 includes a first conductive portion 134a and a second conductive portion 134b. The first conductive portion 134a is formed in each of the first openings 101, conformally covers the sidewalls and the bottom of each of the first openings 101, and is electrically connected to the corresponding conductive pad 106. In some embodiments, during the first conductive portion is formed, the second conductive portion 134b is formed on the second isolation portion 130b, so that the second conductive portion 134b extends from the first conductive portion 134a. In those cases, the first conductive structure 136 may be referred to as a redistribution layer. The first conductive structure 136 is electrically isolated from the substrate 100 via the electrical isolation structure 132 and is in direct electrical contact with or indirectly electrically connected to the exposed conductive pads 106 through the first openings 101.

In some embodiments, the first conductive structure 136 includes aluminum, titanium, tungsten, copper, nickel, gold, or a combination thereof or another suitable conductive material. In some embodiments, the first conductive structure 136 (i.e., the patterned redistribution layer) is formed by successively performing a deposition process (such as a physical vapor deposition process, a chemical vapor deposition process, a plating process, an electroless plating process or another suitable process), a lithography process, and an etching process. For example, a patterned aluminum layer is formed by successively performing a deposition process, a lithography process, and an etching process. Afterwards, a patterned nickel layer and a patterned gold layer are successively formed on the patterned aluminum layer by a similar method, so that the stack of the aluminum layer, the nickel layer, and the gold layer form the first conductive structure 136.

Refer to FIG. 2F, an opening 140 is formed in the substrate 100 of each of the chip regions C, so that the opening 140 extends along the scribe line region SC between the adjacent chip regions C, so as to surround the chip regions C. In some embodiments, In some embodiments, the opening 140 passes through the substrate 100 and the substrate 110 and extends into the spacer layer 120, so that the substrate 100 of the chip regions C are separated from each other, and the substrate 100 of each of the chip regions C has a sidewall surface 100c. In some embodiments, the opening 140 is formed by a pre-cutting process, and the extending depth of the opening 140 in the spacer layer 120 is about a half of the thickness of the spacer layer 120.

Refer to FIG. 2G, a passivation layer 146 is formed to cover the first conductive structure 136 and the electrical isolation structure 132. In some embodiments, the passivation layer 142 is formed over the second surface 100b of the substrate and fills the first openings 101 and the opening 140 by a deposition process, so as to cover the first conductive portion 134a. In some embodiments, the opening 140 is entirely filled with the passivation layer 142, so that the passivation layer extends into the spacer layer 120. Moreover, the passivation layer 142 partially fills the first opening 101, so that a hole 101a is formed between the first conductive portion 134a and the passivation layer 142 in the first opening 101. In other embodiments, the first openings 101 are also entirely filled with the passivation layer 142.

Next, in some embodiments, the passivation layer 142 is patterned by a lithography process and an etching process, so as to form openings 142a that expose portions of the second conductive portion 134b. In some embodiments, the passivation layer includes epoxy resin, solder mask, organic polymer materials (such as polyimide, butylcyclobutene, parylene, polynaphthalenes, fluorocarbons or acrylates), or another suitable insulating material.

Figure 2H:
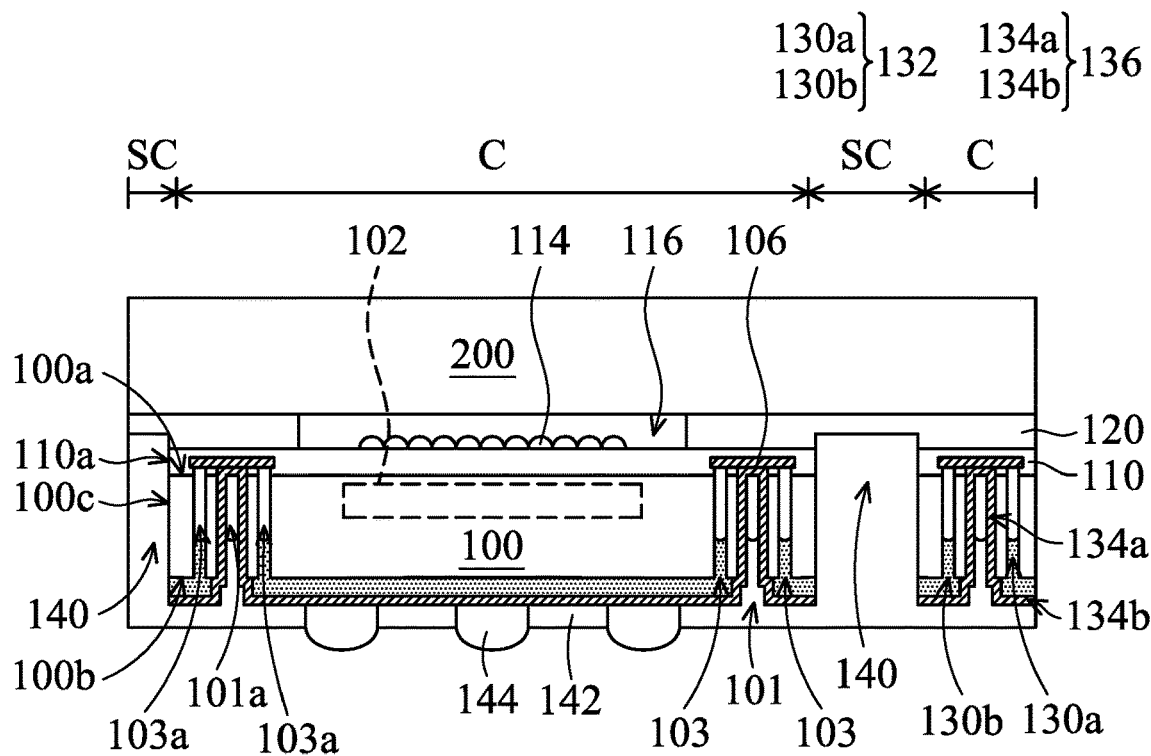

Refer to FIG. 2H, in some embodiments, second conductive structures 144 (such as solder balls, bumps or conductive pillars) are filled into the openings 142a of the passivation layer 142 by a plating process, a screen printing process or another suitable process to electrically connect to the exposed second conductive portion 134b. In some embodiments, the second conductive structures 144 include tin, lead, copper, gold, nickel or a combination thereof.

Afterwards, the substrate 100 of the scribe line region SC and the layers overlying and underlying the substrate 100 of the scribe line region SC are diced, so that the substrate 100 of each of the chip regions C are separated from each other. For example, a dicing saw or laser may be used to perform the dicing process. After the dicing process, individual chip packages 10 are formed, as shown in FIG. 1.

It should be realized that although the embodiments of FIGS. 2A to 2H provide a method for forming a chip package with a front side illumination (FSI) sensing device, the method for forming the external electrical connection paths of the chip (such as the opening in the substrate, the electrical isolation structure, the first conductive structure, the passivation layer, and the second conductive structures) can be implemented to the processes of a back side illumination (BSI) sensing device.

According to the aforementioned embodiments, the first openings 101 and the second openings 103 have perpendicular sidewalls, and the first opening 101 and the second opening 103 entirely correspond within the region of the conductive, as viewed from a top-view perspective. Therefore, the pitch of the conductive pad 106 can be effectively reduced, thereby increasing the number of the conductive pads and design flexibility. Moreover, since the width of the first opening 101 is less than the width of the conductive pad 106, the amount of the passivation layer 142 that covers the through substrate vias can be reduced, thereby reducing the stress induced by the passivation layer 142.

According to the aforementioned embodiments, the through substrate via in the first opening 101 (i.e., the first conductive portion 134a) can be electrically isolated from the substrate 100 via the first isolation portion 132a in the second opening 103.

According to the aforementioned embodiments, since a portion of the substrate 100 surrounds the first opening 101 and is surrounded by the opening 103, the portion of the substrate 100 can serve a portion of the through substrate via. As a result, even if the first conductive portion 134a is fractured, the through substrate via still can effectively and electrically connected to conductive pad 106.

Figure 3:
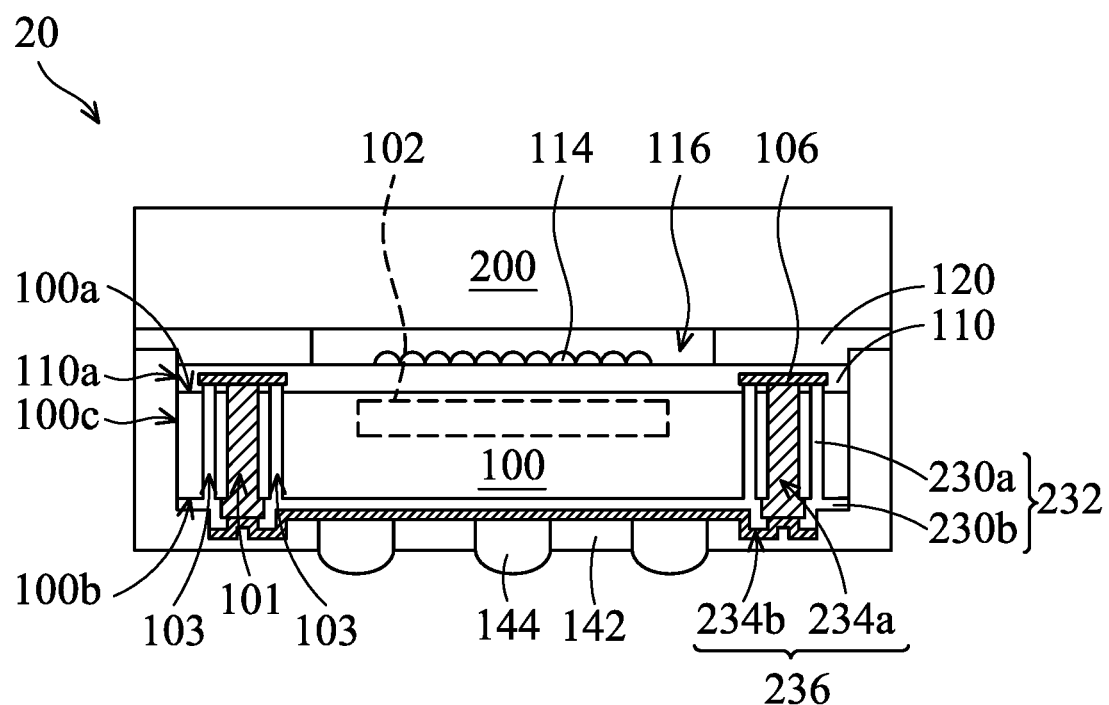
FIG. 3 is a cross-sectional view of an exemplary embodiment of a chip package according to the invention.

Refer to FIG. 3, which is a cross-sectional view of an embodiment of a chip package 20 according to the invention. Elements in FIG. 3 that are the same as those in FIG. 1 are labeled with the same reference numbers as in FIG. 1 and are not described again for brevity. The structure of the chip package 20 is similar to that of the chip package 10 shown in FIG. 1. In some embodiments, unlike the electrical isolation structure 132 of the chip package 10, the electrical isolation structure 232 of the chip package 20 includes a first isolation portion 230a and a second isolation portion 230b. The each of the second openings 103 of the substrate is entirely filled with the first isolation portion 230a. In some embodiments, the electrical isolation structure 232 includes oxide (e.g., silicon oxide) or another suitable inorganic material (such as silicon nitride, silicon oxynitride, metal oxide, or a combination thereof).

In some embodiments, unlike the first conductive structure 136 of the chip package 10, the first conductive structure 236 of the chip package 20 includes a first conductive portion 234a and a second conductive portion 234b. A portion of the first conductive portion 234a protrudes from the second surface 100b of the substrate 100, so that the first conductive portion 234a has a T-shaped profile, and the second isolation portion 230b partially located between the second conductive portion 234b and the portion of the first conductive portion 234a that protrudes from the second surface 100b of the substrate 100. Moreover, the second conductive portion 234b is connected to first conductive portion 234a and extends onto the second isolation portion 230b. In those cases, the first conductive portion 234a may be referred to as a through substrate via. Moreover, the second conductive portion 234b and the first conductive portion 234a are formed of different conductive material layers. For example, the second conductive portion 234b may include aluminum, titanium, tungsten, copper, nickel, gold, or a combination thereof. The first conductive portion 234a may include copper.

Figure 4A:
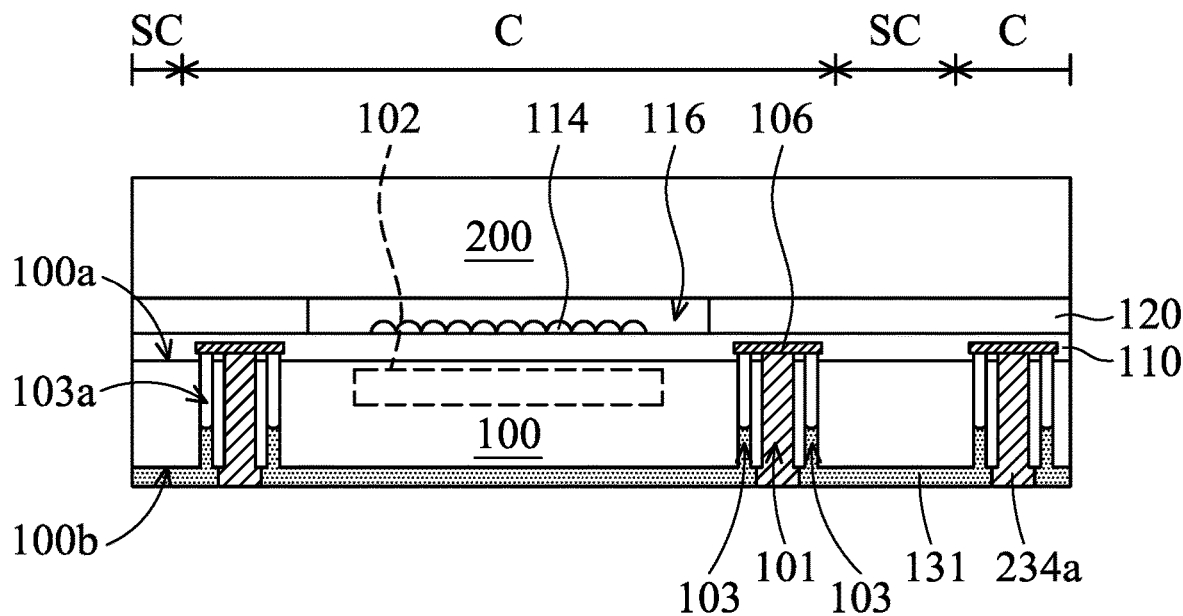
FIGS. 4A to 4D are cross-sectional views of an exemplary embodiment of a method for forming a chip package according to the invention.

FIGS. 4A to 4D are cross-sectional views of an embodiment of a method for forming a chip package according to the invention. Elements in FIGS. 4A to 4D that are the same as those in FIGS. 3 and 2A to 2H are labeled with the same reference numbers as in FIGS. 3 and 2A to 2H and are not described again for brevity. Refer to FIG. 4A, the structure shown in FIG. 2B is provided. Afterwards, a patterned masking layer 131 is formed on the second surface 100b of the substrate 100. In some embodiments, the patterned masking layer 131 partially fills the second opening 103, so as to form a hole 103a between the bottom of the second opening 103 and the patterned masking layer 131. Moreover, the patterned masking layer 131 has openings to expose the first openings 101. In some embodiments, the patterned masking layer 131 includes a photoresist material.

Afterwards, in some embodiments, first conductive portions 234a are formed in the openings of the patterned masking layer 131 to serve as through substrate vias. A portion of the first conductive portion 234a protrudes from the second surface 100b of the substrate 100, so that the first conductive portion has a T-shaped profile. In some embodiments, the first conductive portion 234a includes copper and is formed by a deposition process (such as a plating or electroless plating process).

Figure 4B:
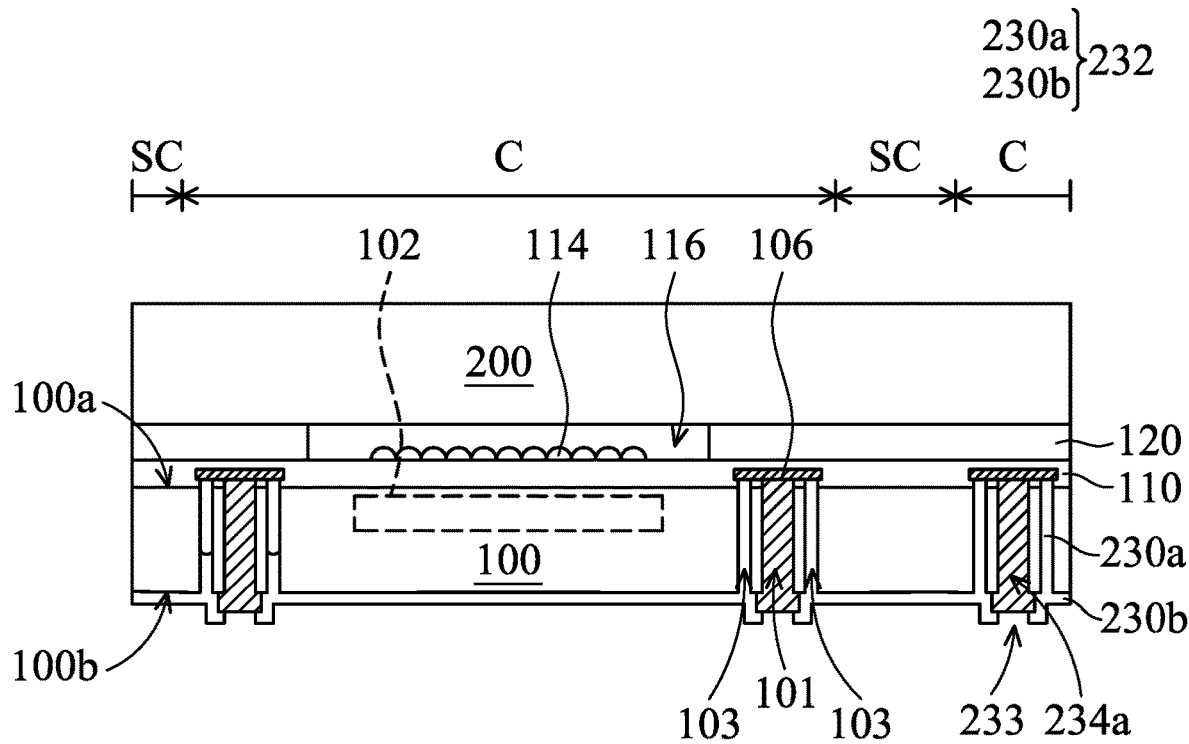

Refer to FIG. 4B, the patterned masking layer 131 is removed. Afterwards, an electrical isolation structure 232 is formed on the second surface 100b of the substrate 100 by a deposition process (such as a coating process, a physical vapor deposition process, a chemical vapor deposition process or another suitable process). The electrical isolation structure 232 includes a first isolation portion 230a and a second isolation portion 230b. Each of the second openings 103 is entirely filled with the first isolation portion 230a, and the second isolation portion 230b covers the first conductive portion 234a and has openings 233 to expose portions of the corresponding first conductive portions 234a. In some embodiments, the electrical isolation structure 232 includes oxide (e.g., silicon oxide) or another suitable inorganic material (such as silicon nitride, silicon oxynitride, metal oxide, or a combination thereof).

Figure 4C:
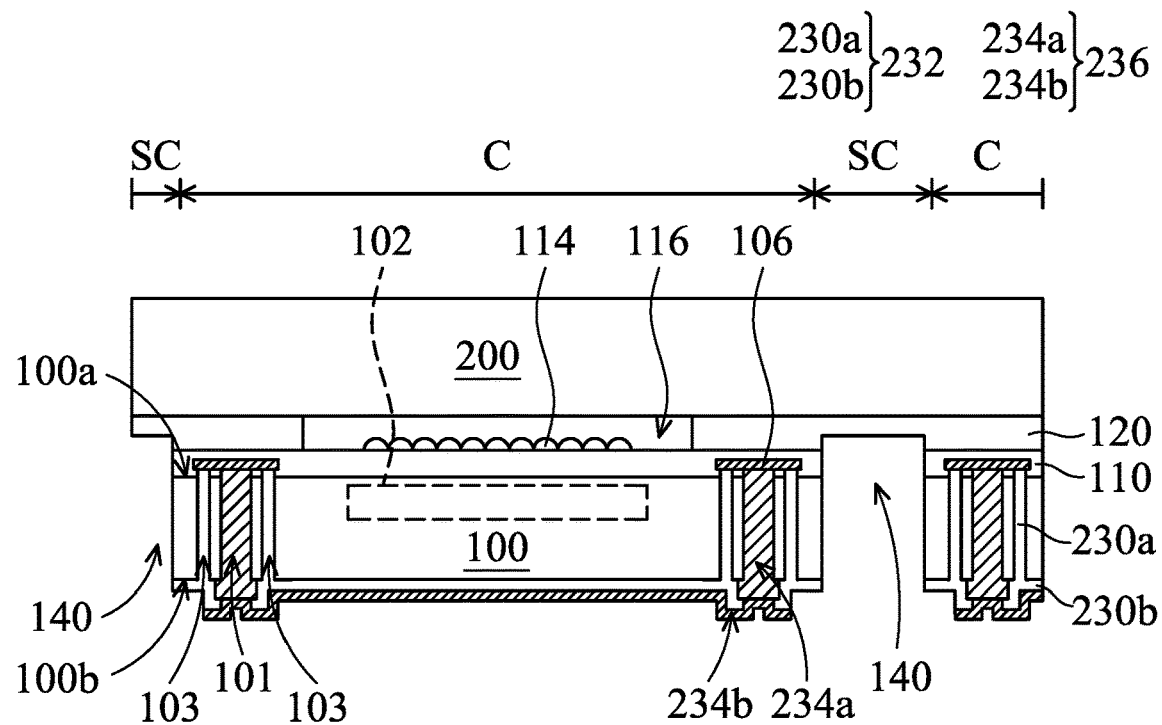

Refer to FIG. 4C, a second conductive portion 234b is formed on the second isolation portion 230b and fills the openings 233 (as indicated in FIG. 4B), to be connected to the first conductive portion 234a. In some embodiments, the material and the formation method of the second conductive portion 234b are the same as or similar to those used for the first conductive structure 136 shown in FIG. 2E. In those cases, the second conductive portion 234b may serve as a redistribution layer. Moreover, the first conductive portion 234a and the second conductive portion 234b form a first conductive structure 236. Afterwards, an opening 140 is formed in the substrate by the same or similar method used in FIG. 2F.

Figure 4D:
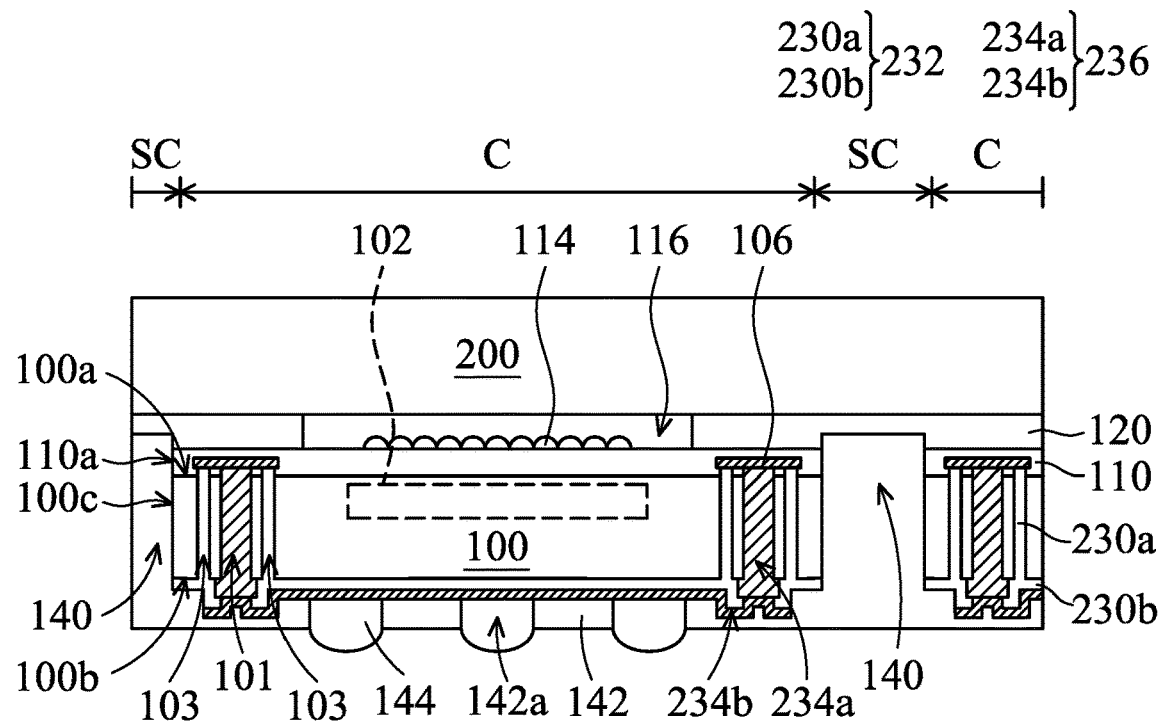

Refer to FIG. 4D, a passivation layer and a second conductive structure 144 are successively formed in the structure of FIG. 4C by the same or similar methods used in FIGS. 2G and 2H.

Afterwards, the substrate 100 of the scribe line region SC and the layers overlying and underlying the substrate 100 of the scribe line region SC are diced, so that the substrate 100 of each of the chip regions C are separated from each other. For example, a dicing saw or laser may be used to perform the dicing process. After the dicing process, individual chip packages 20 are formed, as shown in FIG. 3.

It should be realized that although the embodiments of FIGS. 4A to 4D provide a method for forming a chip package with a front side illumination (FSI) sensing device, the method for forming the external electrical connection paths of the chip (such as the opening in the substrate, the electrical isolation structure, the first conductive structure, the passivation layer, and the second conductive structures) can be implemented to the processes of a back side illumination (BSI) sensing device.

According to the aforementioned embodiments, since the structure of the chip package 20 is similar to the structure of the chip package 10 shown in FIG. 1, the chip package 20 has advantages that are the same as or similar to those of the chip package 10.

According to the aforementioned embodiments, since the first opening 101 in the chip package 20 is entirely filled with the through substrate via (i.e., the first conductive portion 234a) that is formed by a plating process, the reliability of the through substrate via, and the design flexibility and the process window for the subsequent formation of the redistribution layer (i.e., the second conductive portion 234b) can be increased.

Figure 5:
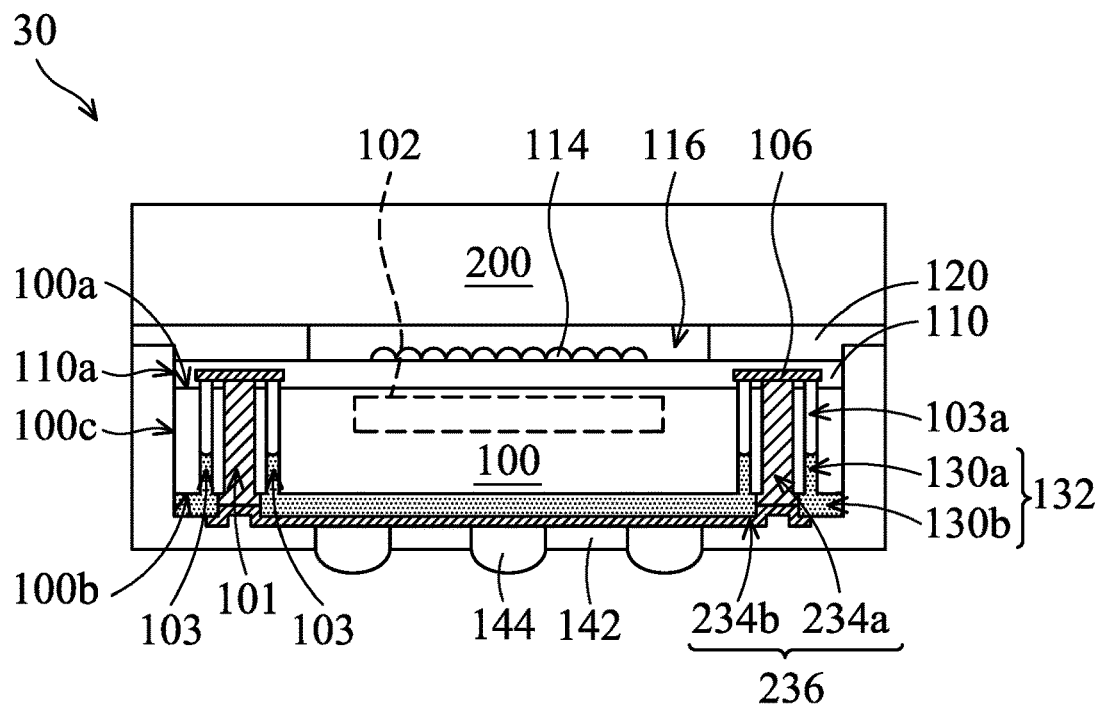
FIG. 5 is a cross-sectional view of an exemplary embodiment of a chip package according to the invention.

Refer to FIG. 5, which is a cross-sectional view of an embodiment of a chip package 30 according to the invention. Elements in FIG. 5 that are the same as those in FIGS. 1 and 3 are labeled with the same reference numbers as in FIGS. 1 and 3 and are not described again for brevity. In some embodiments, the structure and the formation method of the chip package 30 are similar to those of the chip package 20 shown in FIG. 3. The difference is the chip package 30 uses the same electrical isolation structure 132 shown in the chip package 10 of FIG. 1 to replace the electrical isolation structure 232 shown in the chip package 20 of FIG. 3.

According to the aforementioned embodiments, since the structure of the chip package 30 is similar to the structure of the chip package 20 shown in FIG. 3 and uses the electrical isolation structure 132 shown in the chip package 10 of FIG. 1, the chip package 30 has advantages that are the same as or similar to those of the chip packages 10 and 20.

Figure 6:
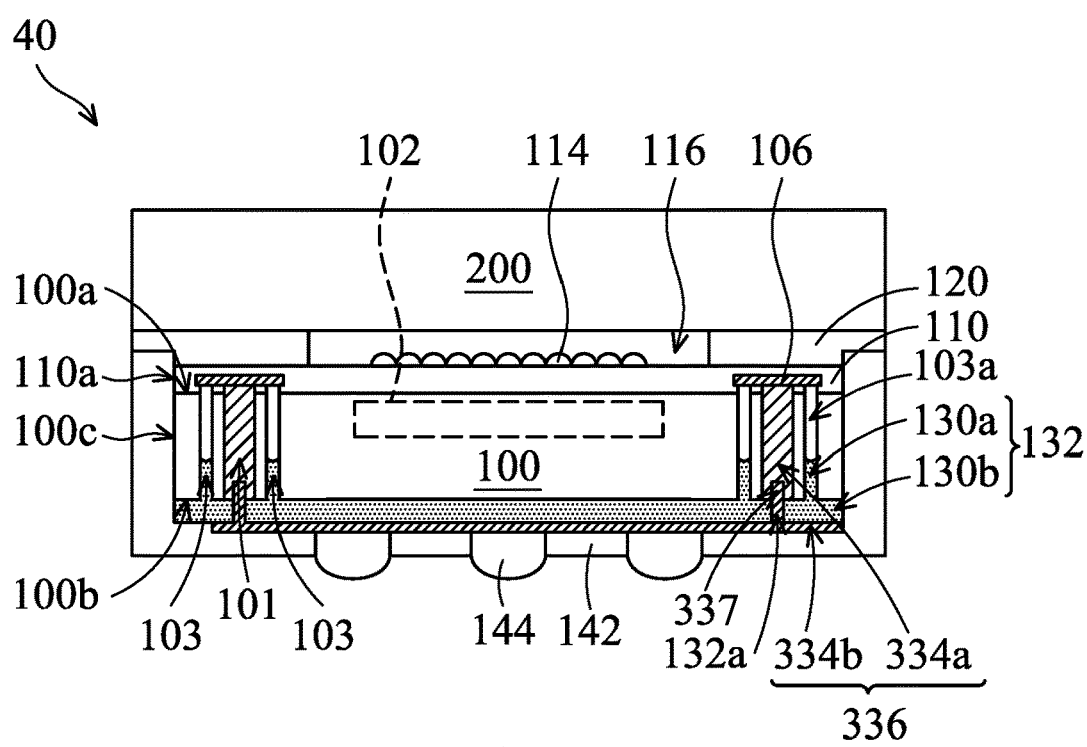
FIG. 6 is a cross-sectional view of an exemplary embodiment of a chip package according to the invention.

Refer to FIG. 6, which is a cross-sectional view of an embodiment of a chip package 40 according to the invention. Elements in FIG. 6 that are the same as those in FIG. 5 are labeled with the same reference numbers as in FIG. 5 and are not described again for brevity. In some embodiments, the structure and the formation method of the chip package 40 are similar to those of the chip package 30 shown in FIG. 5. Unlike the first conductive structure 236 of the chip package 30, the first conductive structure 336 of the chip package 40 includes a first conductive portion 334a and a second conductive portion 334b. The first conductive portion 334a does not protrude the second surface 100b of the substrate 100. The first conductive portion 334a has a recess 337, and the second isolation portion 130b has an opening 132a corresponding to the recess 337, so that the second conductive portion 334b extends over the second surface 100b of the substrate 100 from the recess 337 and the opening 132a.

According to the aforementioned embodiments, since the structure of the chip package 40 is similar to the structure of the chip package 30 shown in FIG. 5, the chip package 40 has advantages that are the same as or similar to those of the chip package 30.

Figure 7:
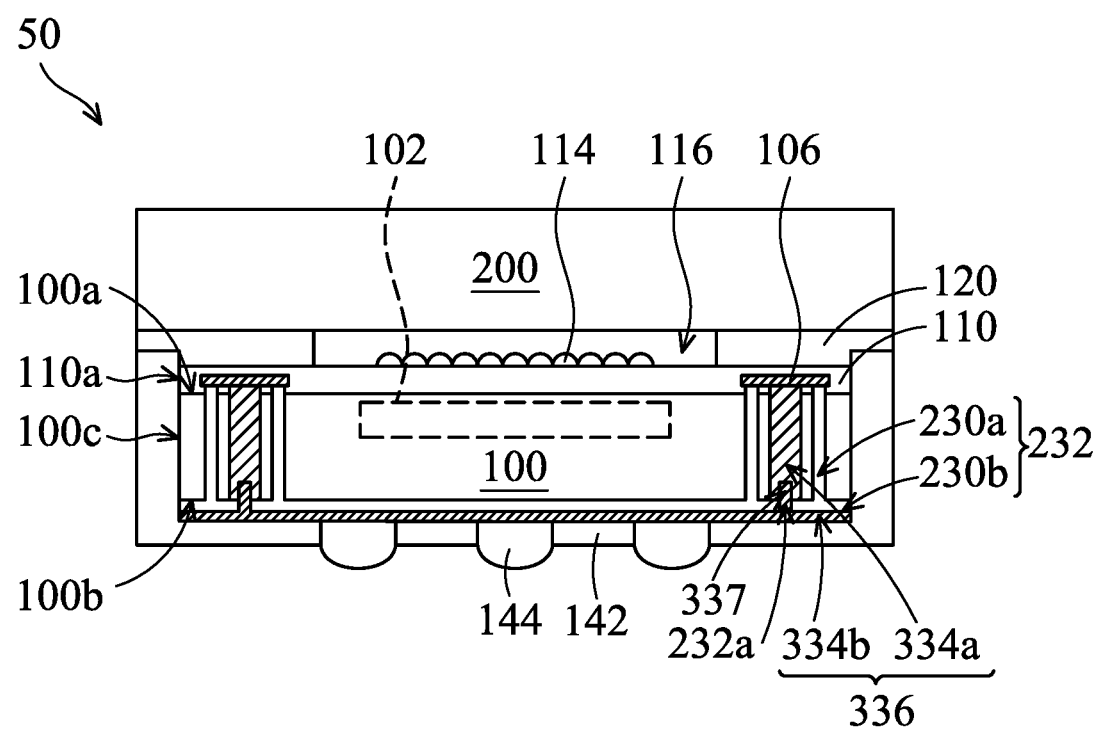
FIG. 7 is a cross-sectional view of an exemplary embodiment of a chip package according to the invention.

Refer to FIG. 7, which is a cross-sectional view of an embodiment of a chip package 50 according to the invention. Elements in FIG. 7 that are the same as those in FIG. 6 are labeled with the same reference numbers as in FIG. 6 and are not described again for brevity. In some embodiments, the structure and the formation method of the chip package 50 are similar to those of the chip package 40 shown in FIG. 6. The difference is the chip package 50 uses the same electrical isolation structure 232 shown in the chip package 20 of FIG. 3 to replace the electrical isolation structure 132 shown in the chip package 40 of FIG. 6. Similarly, the second isolation portion 230b has an opening 232a corresponding to the recess 337, so that the second conductive portion 334b extends over the second surface 100b of the substrate 100 from the recess 337 and the opening 232a.

According to the aforementioned embodiments, since the structure of the chip package 50 is similar to the structure of the chip package 40 shown in FIG. 6 and uses the electrical isolation structure 232 shown in the chip package 20 of FIG. 3, the chip package 30 has advantages that are the same as or similar to those of the chip packages 20 and 40.

While the invention has been disclosed in terms of the preferred embodiments, it is not limited. The various embodiments may be modified and combined by those skilled in the art without departing from the concept and scope of the invention.

What is claimed is:

1. A chip package, comprising:
 a substrate having a first surface and a second surface opposite the first surface, and comprising a first opening and a second opening surrounding the first opening, wherein the substrate includes a sensor device adjacent to the first surface of the substrate;
 a first conductive structure comprising:
  a first conductive portion in the first opening of the substrate; and
  a second conductive portion over the second surface of the substrate;
 an electrical isolation structure comprising:
  a first isolation portion in the second opening of the substrate; and
  a second isolation portion extending from the first isolation portion and between the second surface of the substrate and the second conductive portion; and
 an insulating layer covering the first surface of the substrate, wherein the insulating layer comprises a conductive pad and the first conductive portion extends into the insulating layer to form an electrical connection to the conductive pad,
 wherein the second opening extends into the insulating layer to expose the conductive pad.

2. The chip package as claimed in claim 1, further comprising:
 a passivation layer covering the second conductive portion and the second isolation portion; and
 a second conductive structure passing through the passivation layer, so as to be electrically connected to the second conductive portion.

3. The chip package as claimed in claim 1, wherein the first isolation portion partially fills the second opening of the substrate, so as to form a hole between a bottom of the second opening and the first isolation portion.

4. The chip package as claimed in claim 1, wherein the electrical isolation structure comprises oxide or a photoresist material.

5. The chip package as claimed in claim 4, wherein a portion of the first conductive portion protrudes from the second surface of the substrate, so that the second isolation portion is partially disposed between the second conductive portion and the portion of the first conductive portion protruding from the second surface of the substrate.

6. The chip package as claimed in claim 5, wherein the first conductive portion has a T-shaped profile.

7. The chip package as claimed in claim 1, wherein the first conductive portion has a recess, and the second isolation portion has a third opening corresponding to the recess, so that the second conductive portion extends over the second surface of the substrate from the recess and the third opening.

8. The chip package as claimed in claim 1, wherein the second conductive portion extends from the first conductive portion, so that the second conductive portion and the first conductive portion are formed of the same conductive material layer.

9. The chip package as claimed in claim 1, wherein the second conductive portion is connected to the first conductive portion, and the second conductive portion and the first conductive portion are formed of different conductive material layers.

10. The chip package as claimed in claim 1, wherein the first opening is spaced a distance apart from the second opening, and the distance is less than or equal to a width of the first opening.

11. The chip package as claimed in claim 1, wherein a portion of the conductive pad protrudes laterally from an edge of the second opening.

12. A chip package, comprising:
 a substrate having a first surface and a second surface opposite the first surface, and comprising a first opening and a second opening surrounding the first opening, wherein the substrate includes a sensor device adjacent to the first surface of the substrate;
 a first conductive structure comprising:
  a first conductive portion in the first opening of the substrate; and
  a second conductive portion over the second surface of the substrate;
 an electrical isolation structure comprising:
  a first isolation portion in the second opening of the substrate; and
  a second isolation portion extending from the first isolation portion and between the second surface of the substrate and the second conductive portion;
 a passivation layer covering the second conductive portion and the second isolation portion;

a second conductive structure passing through the passivation layer, so as to be electrically connected to the second conductive portion;

a cover plate disposed over the first surface of the substrate; and a spacer layer disposed between the substrate and the cover plate, wherein the passivation layer extends into the spacer layer along a sidewall surface of an edge of the substrate.

13. A chip package, comprising:

a substrate having a first surface and a second surface opposite the first surface, and comprising a first opening and a second opening surrounding the first opening, wherein the substrate includes a sensor device adjacent to the first surface of the substrate;

a first conductive structure comprising:

a first conductive portion in the first opening of the substrate; and a second conductive portion over the second surface of the substrate;

an electrical isolation structure comprising:

a first isolation portion in the second opening of the substrate; and a second isolation portion extending from the first isolation portion and between the second surface of the substrate and the second conductive portion;

a passivation layer covering the second conductive portion and the second isolation portion; and a second conductive structure passing through the passivation layer, so as to be electrically connected to the second conductive portion, wherein the first conductive portion conformally covers sidewalls and a bottom of the substrate, and the passivation layer extends into the first opening, so as to form a hole between the first conductive portion and the passivation layer in the first opening.

* * * * *